Dec. 17, 1968 B. F. GRIFFIN, JR 3,416,550

FLUID LOGIC CIRCUITS

Filed Oct. 24, 1965 2 Sheets-Sheet 1

INVENTOR
Benjamin F. Griffin, Jr.

BY Griffin and Branigan
ATTORNEYS

INVENTOR

Benjamin F. Griffin, Jr.

BY Griffin and Branigan

ATTORNEYS

United States Patent Office 3,416,550 Patented Dec. 17, 1968

3,416,550

FLUID LOGIC CIRCUITS

Benjamin F. Griffin, Jr., Fairfax County, Va., assignor to Sperry Rand Corporation, New York, N.Y., a corporation of Delaware Filed Oct. 24, 1965, Ser. No. 504,323
7 Claims. (Cl. 137—81.5)

ABSTRACT OF THE DISCLOSURE

A fluid actuated half-adder is provided which includes a pair of pure fluid amplifiers having their power and control input ducts cross-coupled to form two input points and their output channels merged to provide two output points. Binary input signals are applied to the input points so as to develop a logical sum signal at one output point and a carry signal at the other output point.

This invention relates to logic circuits and more particularly to logic circuits employing pure fluid amplifiers and other pure fluid logic elements.

An object of the present invention is to provide novel combinations of pure fluid amplifiers innterconnected in pairs and responsive to first and second input signals for producing an output signal upon the occurrence of one of the input signals concurrently with the absence of the other input signal. Stated differently, an object of the present invention is to provide novel combinations of pure fluid amplifiers interconnected in pairs to perform the Exclusive-Or logical function.

Another object of this invention is to provide two fluid amplifiers interconnected so as to compare two input signals. The amplifiers are in a manner subsequently described in detail so as to produce an output signal if, and only if, the two input signals are unequal.

The Exclusive-Or function is one of the logical functions performed by a binary half-adder. In addition, a half-adder must also perform the logical AND function. By interconnecting two fluid amplifiers as hereinafter described a relatively simple fluid circuit is obtained which performs both the Exclusive-Or logical function and the logical AND function.

Therefore, a further object of the invention is to provide two fluid amplifiers interconnected in a novel manner to half-add first and second fluid binary signals and produce a first output signal when only one input signal is present and a second output signal when both input signals are present.

Still another object of the invention is to provide novel Exclusive-Or and half-adder circuits including a novel circuit for sampling the output signals and storing an indication of the sampled signals. In connection with half-adders, the sample circuit not only samples the logical output signals but provides the means for indicating the equality of two binary input signals when both input signals are logical zero.

Yet another object of the invention is to provide a novel comparison circuit including a bistable fluid amplifier, said circuit being arranged such that one output of the amplifier represents an equality condition and the other output represents a condition of inequality between two input signals.

The specific manner in which the above and other objects are accomplished will become apparent upon consideration of the following description and the accompanying drawings in which.

Figures 1, 2, 3, 4, 5:
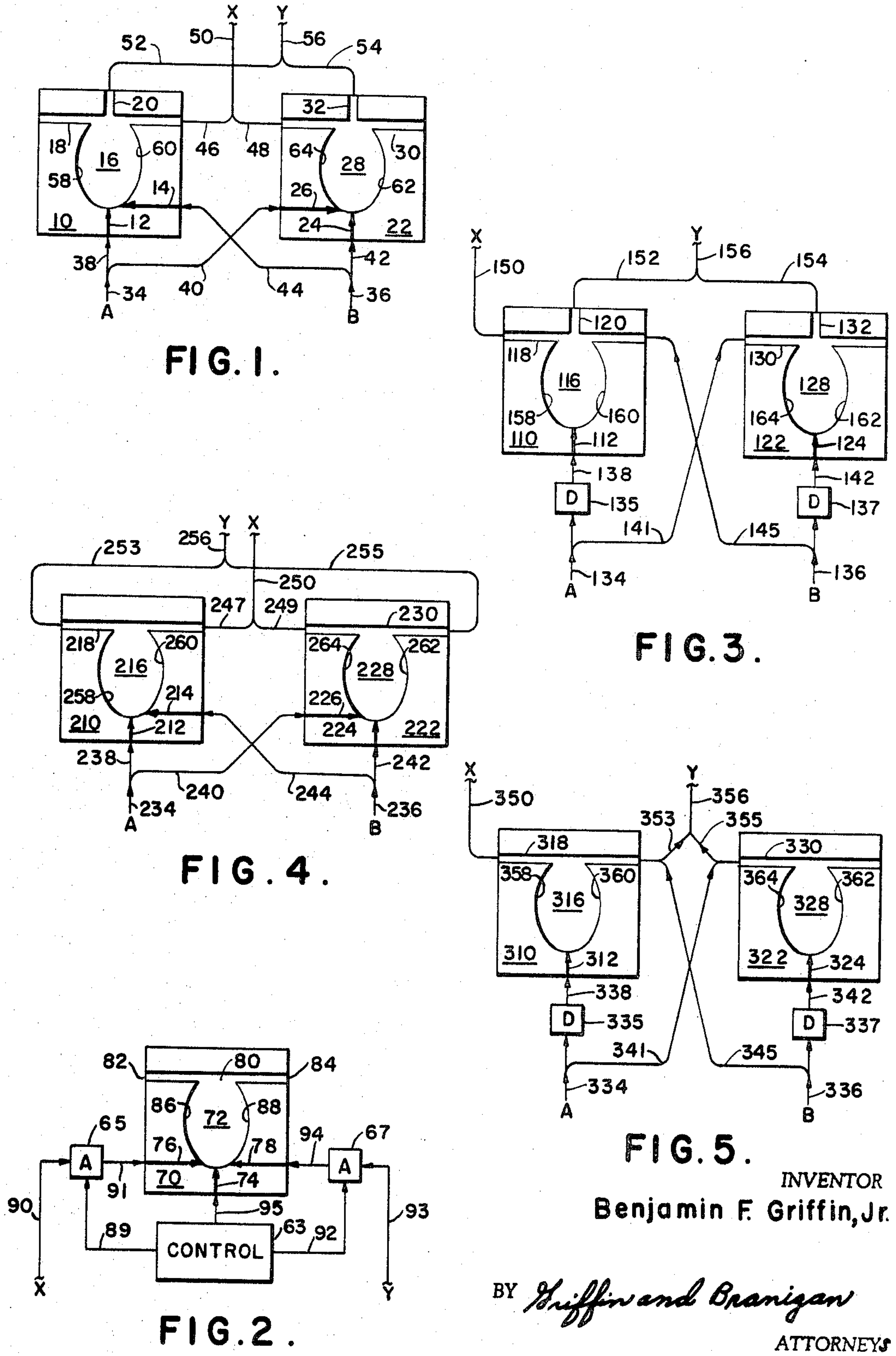
FIGURE 1 is a schematic diagram of a first embodiment of a half-adder employing two fluid amplifiers of the type having a vortex chamber.
FIGURE 2 is a schematic diagram of an output sample and timing circuit suitable for use in combination with the half-adders shown in each of the other figures.
FIGURE 3 is a schematic diagram of a second embodiment of a half-adder employing two fluid amplifiers of the type having a vortex chamber.
FIGURE 4 is a schematic diagram of a third embodiment of a half-adder employing two fluid amplifiers of the type having a vortex chamber.
FIGURE 5 is a schematic diagram of a fourth embodiment of a half-adder employing two fluid amplifiers of the type having a vortex chamber.

Referring now to FIGURE 1, there is shown a half-adder circuit responsive to first and second input signals A and B and producing a first output signal X according to the logical equation $X=AB$ and producing a second output signal Y according to the logical equation $Y=A\overline{B}+\overline{A}B$ where + represents the logical Or function and the bar $\overline{(\ )}$ represents the logical Not. In FIGURE 1, as in the other embodiments described herein, the logical Not or binary zero is represented by the absence of fluid flow whereas a binary one is represented by the presence of fluid flow.

The half-adder comprises a first fluid amplifier 10 having a power stream nozzle 12, a control nozzle 14, a vortex chamber 16, and first and second output channels 18 and 20; and a second fluid amplifier 22 having a power stream nozzle 24, a control nozzle 26, a vortex chamber 28, and first and second output channels 30 and 32.

Two fluid binary signal sources (not shown) selectively produce the signals A and B which are applied to first and second input pipes 34 and 36 respectively. Pipe 34 is connected by means of a pipe 38 to the power stream nozzle 12 and is also connected by means of a pipe 40 to the control nozzle 26. Pipe 36 is connected by means of a pipe 42 to the power stream nozzle 24 and by means of a pipe 44 to the control nozzle 14.

The first output channels 18 and 30 are connected to a pair of pipes 46 and 48 and at their downstream extent these latter pipes join with a further pipe 50. The second output channels 20 and 32 are connected to a pair of pipes 52 and 54 and these pipes connected at their downstream extent with a further pipe 56.

Fluid amplifiers 10 and 22 are of the type disclosed in Patent No. 3,192,938 to which reference may be made for a detailed description of the construction and theory of operation of the amplifiers.

Fluid amplifier 10 is constructed such that, in the absence of a control signal at nozzle 14, a power stream injected into vortex chamber 16 from power stream nozzle 12 flows straight through the vortex chamber and second output channel 20 to the pipe 52. On the other hand, if a power stream is injected into the vortex chamber from nozzle 12 at the same time that a control stream is injected into the chamber from nozzle 14, the control stream strikes the power stream and deflects it toward the wall 58.

The amount of deflection is dependent in the first instance upon the relative magnitudes of the control stream and power stream. However, as explained in Patent No. 3,192,938, any deflection of the power stream causes a positive feedback signal within the vortex chamber which aids in further deflecting the power stream. The contour of the vortex chamber in the region where it intersects output channel 18 is such that a portion of the power stream is diverted downwardly along wall 60 and against the power stream issuing from nozzle 12 so that the power stream causes its own deflection. As long as the control stream continues there is a clockwise circulation of fluid in chamber 16 which pushes the power stream toward wall 58 so that it flows along wall 58 and through channel 18 to pipe 46. This action is quite fast and occurs as soon as a control stream issues from nozzle 14. Only a small portion of the power stream is diverted back to form the clockwise vortex flow the major portion of the power stream flows into the output channel 18.

Amplifier 22 operates in substantially the same manner as amplifier 10. However, as viewed in FIGURE 1 the control nozzle 26 of amplifier 22 is on the left side hence the vortex flow which occurs in the chamber due to concurrently applied power and control streams circulates in a counter-clockwise direction.

There are four possible combinations of the input signals A and B. These combinations as well as the resulting output signals X and Y are summarized in Tables I and II. The operation of the circuit shown in FIGURE 1 will now be described for each of the four combinations.

| | A | $\overline{A}$ |
|---|---|---|
| B | 1 | 0 |
| $\overline{B}$ | 0 | 0 |

X output
Table I

| | A | $\overline{A}$ |
|---|---|---|
| B | 0 | 1 |
| $\overline{B}$ | 1 | 0 |

Y output
Table II

*Case I, $\overline{A}$ and $\overline{B}$:* In this case neither signal A nor signal B is present so there is no power stream flow into either amplifier. The circuit is entirely passive hence there is no fluid flow through either the X output channel 50 or the Y output channel 56. Reference to Table I shows that when the input signals are $\overline{A}$ and $\overline{B}$ the X output is a binary zero. Similarly, with input signals $\overline{A}$ and $\overline{B}$ Table II shows that the Y output is a binary zero.

*Case II, $\overline{A}$ and B:* In this case there is no fluid signal applied to pipe 34 but there is fluid flow into pipe 36. A portion of the fluid in pipe 36 flows through pipe 44 and nozzle 14, and into chamber 16. However, since there is no power stream flow into chamber 16 the signal from control nozzle 14 has no effect. At this point it should be noted that the magnitude of the control signals employed in this and other embodiments herein described is considerably smaller than the magnitude of the power streams. This may be accomplished by any one of several conventional means. For example, in FIGURE 1 the size of pipes 40 and 44 may be chosen small enough so that the magnitude of the signals flowing therethrough is limited in magnitude. Alternatively, porous plugs may be inserted in the pipes to limit fluid flow. In any event, the control signals are of such magnitude that the output from an amplifier resulting only from the control signals is much smaller than the output resulting from power stream flow into the amplifier. The circuits responding to the half-adder outputs may be designed in a conventional manner to discriminate between the two conditions so as to respond when there is an output resulting from power stream flow but not respond when the output results only from control signal flow. Therefore, for the case where there is a control signal applied to nozzle 14 but no power stream applied to nozzle 12, there is fluid flow from amplifier 10 but it is negligible and treated as a no-signal condition.

The fluid signal B applied to pipe 36 passes through pipe 42 and power nozzle 24 and enters vortex chamber 28.

Since no signal is being applied to pipe 34 at this time there is no control stream entering chamber 28 from control nozzle 26. Therefore, the power stream flows across chamber 28 into output channel 32 from whence it flows through pipes 54 and 56 to the Y output. This agrees with Table II which shows that for the input conditions $\overline{A}$ and B the Y output is a binary 1.

Since there is no output at all from amplifier 10 and since the power stream of amplifier 22 flows out of the amplifier through channel 32, there is no output flow into pipes 46 and 48 which connect with the X output pipe 50. This is in agreement with Table I which shows that for the input conditions $\overline{A}$ and B the X output is a binary 0.

*Case III, A and $\overline{B}$:* Since there is no B signal there is no fluid flow into power nozzle 24 and control nozzle 14. With no power stream input amplifier 22 produces no output signal. The A signal applied to pipe 34 flows through pipe 38, across chamber 16 and through channel 20 and pipes 52 and 56 to produce a Y output signal. These conditions agree with Table II which shows that for the input conditions A and $\overline{B}$ the Y output should be a binary 1.

*Case IV, A and B:* The A signal flows through pipe 34, pipe 38 and power stream nozzle 12 and enters chamber 16. A portion of the A signal flow also passes from pipe 34, over pipe 40 to control nozzle 26.

The B signal flows through pipe 36, pipe 42 and power stream nozzle 24 and enters chamber 28. A portion of the B signal flow also passes from pipe 36, over pipe 44 to control nozzle 14.

In amplifier 10, the control stream from nozzle 14 deflects the power stream entering the chamber from nozzle 12. The power stream is deflected to the left so that it flows along oval shaped wall 58 into the output channel 18. The power stream enters channel 18 in a direction such that it flows through pipes 46 and 50 to the X output. This agrees with Table I which shows that for the input conditions A and B the X output should be a binary 1.

In amplifier 22, the control stream from nozzle 26 deflects the power stream entering the chamber from nozzle 24. The power stream is deflected to the right so that it flows along oval shaped wall 62 into the output channel 30. The power stream enters channel 30 in a direction such that it flows through pipes 48 and 50 to the X output.

As previously explained, the output from amplifier 10 also flows to the X output. Therefore, the pipe 48 is not necessary and may be removed without affecting the outputs obtained from the half-adder.

Since the outputs from both amplifiers 10 and 22 both flow to the X output there is no flow to the Y output. This agrees with Tables I and II which show that for the condition where the A and B signals are both present the X output should be a binary 1 and the Y output should be a binary 0.

Even though the input signals A and B may be clocked or conditioned by timing pulses to occur simultaneously, there is a possibility that one signal might lead the other by a small increment in time. Also, the response times of the amplifiers may differ so that one might produce an output signal before the other even though input signals are applied to both amplifiers at exactly the same instant. Under either of these conditions the half-adder of FIGURE 1 might momentarily produce an erroneous output signal. For example, assume that fluid signals are simultaneously applied to both inputs A and B. The first portion of the power stream created by the A signal might flow through chamber 16 and channel 20 before the B signal can flow through pipe 44 and nozzle 14 to deflect it. This would cause the X output to momentarily become a binary one when it should in fact be zero.

The circuit of FIGURE 2 is designed to overcome this problem as well as another problem subsequently discussed. The circuit includes a control element 63, first and second fluid AND gates 65 and 67, and a bistable fluid amplifier 70.

The amplifier 70 may be any one of the several types of fluid amplifiers now in common use but for the purpose of illustration is shown as being of the type disclosed in FIGURE 2 of Patent No. 3,192,938. It includes a vortex chamber 72, a power stream nozzle 74, first and second control nozzles 76 and 78, and an output channel 80. The chamber has opposed oval walls 86 and 88 shaped at the junction with channel 80 so that a power stream flowing from nozzle 74 along wall 86 is directed into channel 80 as to flow toward outlet 84, and a power stream flowing from nozzle 74 along wall 88 is directed into channel 80 so as to flow toward outlet 82.

AND gates 65 and 67 may be fluid amplifiers of the type disclosed in Patent No. 3,107,850. AND gate 65 may have a power nozzle connected to control means 63 by a pipe 89 and a control nozzle for receiving fluid signals over a pipe 90. Upon simultaneous occurrence of fluid signals on pipes 89 and 90 AND gate 65 produces a fluid signal which is applied over a pipe 91 to control nozzle 76.

AND gate 67 may have a power nozzle connected to control means 63 by a pipe 92 and a control nozzle for receiving fluid signals over a pipe 93. Upon simultaneous occurrence of fluid signals on pipes 92 and 93 AND gate 67 produces a fluid signal which is applied over a pipe 94 to control nozzle 78.

Control means 63 may be a fluid control circuit of conventional design for producing sequences of fluid pulses at timed intervals. Although not shown in either FIGURE 1 or FIGURE 2, control means 63 may include the clock pulse generator which produces the timing pulses that condition or time the input signals A and B. Preferably, the signals produced by control means 63 in pipes 89 and 92 occur simultaneously. Furthermore, it is preferable that these signals be of shorter duration than the signals A and B. Timewise, the center of the signals in pipes 89 and 92 should coincide with the center of the X and Y signals appearing on leads 90 and 93.

The control means has a further output which is connected by a pipe 95 to the power nozzle 74.

The signals applied to pipe 95 should coincide with the signals applied to pipes 89 and 92.

Since the signal on pipes 89 and 92 condition the gates 65 and 67 to sample the signals X and Y only after the signals X and Y have reached their steady state value, no erroneous signals can reach amplifier 70 to change its state.

The circuit of FIGURE 2 operates as follows. Assume that the signals on pipes 90 and 93 have reached their steady state value. From the foregoing description of FIGURE 1 it is evident that there can be fluid flow in pipe 90 or pipe 93 but not both pipes simultaneously. Assume that the flow is in pipe 90. When the control means produces the timing signals in pipes 90 and 95 the timing signal in pipe 90 flows through AND gate 65, pipe 91, and nozzle 76 to the chamber 72. The timing signal in pipe 95 passes through nozzle 74 to chamber 72 where it is deflected by the fluid issuing from nozzle 76. The deflected fluid flows along wall 88 and into channel 80 from whence it flows toward the outlet 82.

As explained in Patent No. 3,192,938, the vortex chamber of a fluid amplifier may be made asymmetrical to a degree such that the power stream initially assumes a preferred stable state of flow if there are no control streams applied to the chamber. As explained in the patent, the asymmetry creates an unequal pressure distribution which deflects the power stream. This initial pressure distribution deflects the power stream slightly and the shape of the chamber induces a vortex flow in the chamber which further deflects the power stream.

The chamber 72 is asymmetrically constructed so that upon initiation of a power stream concurrently with the absence of any control streams, the power stream is deflected toward wall 88 and flows along this wall and through channel 80 to the outlet 82. This might occur if A and B are both zero so that there is no fluid flow in either pipe 90 or pipe 93 at the time the control means applies the signals to pipes 89, 92, and 95. Under these conditions the fluid signal in pipe 89 is diverted at AND gate 65 and does not reach control nozzle 76. In like manner, the fluid signal in pipe 92 is diverted at and gate 67 and does not reach control nozzle 78. However, the fluid signal applied to pipe 95 passes through nozzle 74 and flows along wall 88 from whence it flows to the outlet 82.

From the above description it is evident that a fluid signal may be produced at outlet 82 under either one of two conditions. First, if $A=B=1$ the signal X deflects the power stream toward wall 88 so that it flows toward outlet 82. Second, if $A=B=0$ the absence of any control streams allows the asymmetry of the chamber to be the controlling factor and this deflects the power stream toward wall 88 so that it flows toward outlet 82. Thus, fluid flow at outlet 82 always provides a positive indication that $A=B$ regardless of whether the two signals are both one or both zero.

There is fluid flow from outlet 84 when the signals A and B are unequal. As explained with reference to FIGURE 1, the signal Y is 1 whenever A and B are unequal. The Y signal is applied to AND gate 67 and when the control means produces timing signals in pipes 89, 92, and 95 it diverts the signal in pipe 92 into pipe 94. This signal flows through control nozzle 78 and enters chamber 72, where it strikes the timing signal entering the chamber through power nozzle 74. The signal from nozzle 74 is deflected to wall 86 so that it flows along this wall and through channel 80 to the outlet 84.

In summary, the circuit of FIGURE 2 provides several advantages when used in conjunction with the half-adder of FIGURE 1. First, it times the sampling of signals to prevent erroneous output signals. Secondly, it provides a positive indication manifested by fluid flow at outlet 82 even though both input signals A and B are zero. Thirdly, the bistable amplifier 70 provides for temporary storage of the output signal for the duration of the timing pulse in pipe 95, with immediate automatic clearing of the stored value upon termination of the timing pulse.

FIGURE 3 shows a further embodiment of a half-adder employing vortex amplifiers. The half-adder comprises a first fluid amplifier 110 having a power stream nozzle 112, a vortex chamber 116, a first output channel 118 and a second output channel 120, and a second fluid amplifier 122 having a power stream nozzle 124, a vortex chamber 128, a first output channel 130 and a second output channel 132.

A first sequence of signals A is applied to the power nozzle 112 through a fluid capacitance 135 and a second sequence of signals B is applied to the power nozzle 124 through a further fluid capacitance 137. In addition, the first sequence of signals is applied over pipes 134 and 141 to output channel 130 and the second sequence of signals is applied over pipes 136 and 145 to output channel 118.

The amplifiers 110 and 122 are constructed and operated according to the method described in Patent No. 3,182,676 wherein control signals of relatively small magnitude are applied to the amplifiers through the output channels. These control signals create small fluid vortex flows in the vortex chambers of sufficient magnitude to influence the direction of power streams which are initiated after the vortex flows are established.

For the case where input signals A and B are both zero, there is no fluid flow into pipes 134 and 136. Consequently, there is no power stream flow into either amplifier so there is no output flow through either of the output pipes 150 and 156.

For the case where A is one and B is zero there is fluid flow into pipe 134 but no fluid flow into pipe 136. The input signal flow is from pipe 134, through delay 135, pipe 138, power nozzle 112, vortex chamber 116 and pipe 152 to output pipe 156 from whence it may be applied to pipe 93 of FIGURE 2.

A portion of the input signal applied to pipe 134 passes through pipe 141, the output channel 130 of amplifier 122, and into the chamber 128 to create a small control vortex in the chamber. However, this control vortex performs no useful purpose since there is no power stream flow into the amplifier.

When input signal A is zero and input signal B is one there is fluid flow into pipe 136 but no fluid flow into pipe 134. The signal in pipe 136 flows through delay 137, pipe 142, power nozzle 124, chamber 128, channel 132, and pipe 154 to output pipe 156. A portion of the input signal to pipe 136 is directed through pipe 145 and channel 118 to create a control vortex flow in amplifier 110 but it is of no consequence at this time because there is no power stream flow into the amplifier.

For the case where A and B are both one there is input signal flow into both pipes 134 and 136. A portion of the fluid in pipe 134 creates a small control vortex in chamber 128 which flows in a clockwise direction. The flow path is from 134 through 141 and 130, then downwardly along wall 162 and upwardly along wall 164 in a circular path. At the same time, a portion of the fluid in pipe 136 creates a small control vortex in chamber 116 which flows in a counter-clockwise direction. The flow path is from 136 through 145 and 118, then downwardly along wall 158 and upwardly along wall 164 in a circular path.

The delay elements delay the fluid signals applied to them over pipes 134 and 136. This delay is sufficient to allow the control vortex flow to be established in chambers 116 and 128 before the power streams are applied. After being delayed by element 135 the signal from pipe 134 passes through pipe 138 and power stream nozzle 112 to enter the chamber 116. As explained in Patent No. 3,182,-676, the control vortex flow is sufficient to influence the direction of power stream flow as the power stream is initiated. In amplifier 110 the counter-clockwise flow deflects the power stream from nozzle 112 toward wall 160. The power stream flows upwardly along wall 160, into channel 118 and pipe 150 from whence it may be applied to the pipe 90 in FIGURE 2. Once the power stream becomes established it feeds back, in part, into the control vortex so as to maintain its flow along wall 160 until it is terminated.

At the same time the power stream is applied to chamber 116, the delayed input signal from pipe 136 is applied to chamber 128. The control vortex in chamber 128 deflects the power stream from nozzle 124 toward wall 164 so that it flows upwardly along the wall and into the right leg of channel 130 as viewed in FIGURE 3. The power stream may be exhausted to the atmosphere from channel 130.

FIGURE 4 shows still another embodiment of a half-adder employing two vortex amplifiers. The amplifiers are constructed and operate in the manner described in Patent No. 3,192,938. The vortex chamber 216 is asymmetrical so that, in the absence of any control stream inputs, a newly initiated power stream tends to deflect toward wall 260 and flow along this wall into output channel 218 and pipe 253. In like manner, the vortex chamber 228 is asymmetrical so that, in the absence of any control stream inputs, a newly initiated power stream tends to deflect toward wall 264 and flow along this wall into output channel 230 and pipe 255.

If input signals A and B are both zero there is no fluid flow into pipes 234 and 236 and therefore no output from either of the amplifiers 210 and 222.

If input signal A is one and input signal B is zero there is fluid flow into pipe 234 but no fluid flow into pipe 236. The fluid flow path from pipe 234 is through pipe 238, power nozzle 212, along wall 260, through channel 218, pipe 253 and pipe 256 to the Y signal output.

On the other hand, if input signal A is zero and input signal B is one there is fluid flow into pipe 236 but no fluid flow into pipe 234. The fluid flow path from pipe 236 is through pipe 242, power nozzle 224, along wall 264, through channel 230, pipe 255 and pipe 256 to the Y signal output.

When input signals A and B are both one there is fluid flow into both pipes 234 and 236. The flow into pipe 234 divides with the major portion flowing through nozzle 212 to create a power stream in chamber 216 and a minor portion flowing through pipe 240 and nozzle 226 to create a control stream in chamber 228. Simultaneously, the flow into pipe 236 divides with the major portion flowing through nozzle 242 to create a power stream in chamber 228 and a minor portion flowing through pipe 244 and nozzle 214 to create a control stream in chamber 216.

In chamber 216 the control stream from nozzle 214 deflects the power stream so that it flows along wall 258, through channel 218, pipe 247 and pipe 250 to the X output. In chamber 228 the control stream from nozzle 226 deflects the power stream so that it flows along wall 262, through channel 230, pipe 249 and pipe 250 to the X output. Since the outputs through pipes 247 and 249 are redundant, one of the pipes may be eliminated and the corresponding signal exhausted to the atmosphere if desired.

FIGURE 5 illustrates yet another embodiment of a half-adder employing two vortex amplifiers. The half-adder includes two fluid amplifiers 310 and 322. Amplifier 310 includes a power stream nozzle 312, a vortex chamber 316 and an output channel 318. Amplifier 322 includes a power stream nozzle 324, a vortex chamber 328, and an output channel 330.

A first sequence of signals is applied to an input pipe 334 and a second sequence of signals is applied to an input pipe 336. Signals in pipe 334 are applied through a delay element 335 to the nozzle 312 and through pipe 341 and channel 330 to the chamber 328. Signals in pipe 336 are applied through a delay element 337 to the nozzle 324 and through pipe 345 and channel 318 to the chamber 316.

The control signals applied to chambers 316 and 328 through the channels 318 and 330, respectively, create control vortex flows in the same manner as explained in connection in FIGURE 3. Furthermore, the delay elements 335 and 337 serves the same function as the delay elements 135 and 137 of FIGURE 3. That is, the delay elements delay initiation of the power streams in the vortex chambers until after the control vortex flows have been established.

The vortex chamber 316 is asymmetrical with respect to power stream nozzle 312 so that, in the absence of a control vortex flow at the time the power stream is initiated, the power stream deflects toward wall 358, flows along the wall, through output channel 318 and pipe 353. In like manner, the vortex chamber 328 is asymmetrical with respect to power stream nozzle 324 so that, in the absence of a control vortex flow at the time the power stream is initiated, the power stream deflects toward wall 362, flows along the wall, through output channel 330 and pipe 355.

The half-adder of FIGURE 5 functions as follows. For the condition where A and B are both zero there is no fluid flow into either pipe 334 or 336 and neither amplifier produces an output signal.

For the condition where A is one and B is zero there is fluid flow through pipe 334, delay element 335, pipe 338, and nozzle 312 to chamber 316. The asymmetry of the chamber causes the fluid to flow along wall 358 and it passes through channel 318 and pipes 353 and 356 to the Y output. For the condition where A is zero and B is one there is fluid flow through pipe 336, delay element 337, pipe 342, and nozzle 324 to chamber 328. The asymmetry of the chamber causes the fluid to flow along wall 362 and it pass through channel 330 and pipes 355 and 356 to the Y output.

When A and B are both one there is fluid flow into both pipes 334 and 336. A portion of the fluid from pipe 334 passes over pipe 341 and channel 330 to create a clockwise control vortex in chamber 328. At the same time, a portion of the fluid from pipe 336 passes over pipe 345 and channel 318 to create a counter-clockwise control vortex in chamber 316. After both control vortex flows are established part of the fluid passing through pipe 334 emerges from delay element 335 and is applied to nozzle 312 to create a power stream in chamber 316. Concurrently, part of the fluid passing through pipe 336 emerges from delay element 337 and is applied to nozzle 324 to create a power stream in chamber 328.

In chamber 316 the control vortex flow deflects the power stream toward wall 360. The power stream flows upwardly along this wall, through channel 318, and through pipe 350 to the X output. In chamber 328 the control vortex flow deflects the power stream toward wall 364. The power stream flows upwardly along this wall and through channel 330 from whence it is exhausted to the atmosphere.

Figure 6:
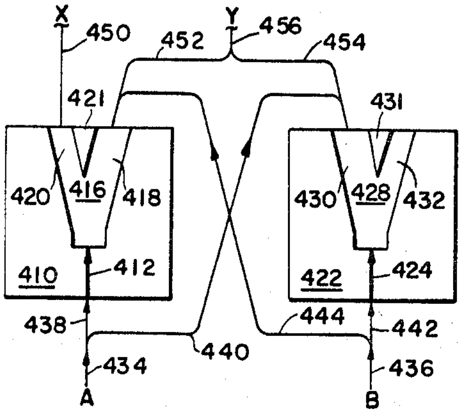
FIGURE 6 is a schematic diagram of a first embodiment of a half-adder employing two fluid amplifers of a type switchable by backloading an output channel.

FIGURE 6 illustrates a half-adder employing two fluid amplifiers 410 and 422. Amplifier 410 has a power stream nozzle 412, an interaction chamber 416, and first and second output channels 418 and 420 separated by a dividing element 421. The right wall of chamber 416 is offset slightly from the power nozzle orifice so that a power stream issuing from the nozzle tends to lock on the wall by virtue of the well known boundary layer effect and flow out through channel 418. The left wall of chamber 416 is offset sufficiently far from the power nozzle orifice to prevent the power stream from locking on to this wall. Details of the construction of amplifiers of this type are well known and are set forth in Patent No. 3,001,698. As explained in the patent, amplifiers of this type can be switched by "backloading" or by increasing the pressure in the output channel 418.

Amplifier 422 is similar to amplifier 410 and includes a power stream nozzle 424, an interaction chamber 428 and first and second output channels 430 and 432 separated by a dividing element 431. The walls of the interaction chamber 428 are positioned such that a power stream normally locks on to the left wall and flows into channel 430 but can be switched to flow into channel 432 by increasing the pressure in channel 430.

A first sequence of signals is applied through pipes 434 and 438 to the power nozzle 412 and also applied through pipes 434 and 440 to the output channel 430. A second sequence of signals is applied through pipes 436 and 442 to the power nozzle 424 and also applied through pipes 436 and 444 to the output channel 418. Output channels 418 and 431 are also connected by means of pipes 452 and 454, respectively, to an output pipe 456. A further output pipe 450 is connected to the channel 420.

The half-adder of FIGURE 6 functions as follows. When the input signals A and B are both zero there is no fluid input to either of the pipes 434 and 436 hence there is no fluid flow out of either amplifier to either the X or the Y output.

When the input signal A is one and the signal B is zero fluid flows through pipes 434 and 438, nozzle 412, channel 418, and pipes 452 and 456 to the Y output. When the input signal A is zero and the signal B is one fluid flows through pipes 436 and 442, channel 430, and pipes 454 and 456 to the Y output.

When the input signals A and B are both one, fluid flows into both pipes 434 and 436. Part of the fluid from pipe 434 flows through pipe 438 and nozzle 412 to create a power stream in chamber 416. At the same time, part of the fluid from pipe 436 flows through pipe 444 and is applied in the reverse direction to channel 418. This backloads channel 18 thus causing the power stream from nozzle 412 to flow through channel 420 and pipe 450 to the X output. Concurrently with these events part of the fluid from pipe 434 is conveyed over pipe 440 to the channel 430 and part of the fluid from pipe 436 is conveyed over pipe 442 to nozzle 424. The fluid applied to channel 430 backloads the channel so that the power stream which issues from nozzle 424 is deflected through channel 432 to the atmosphere.

Figure 7:
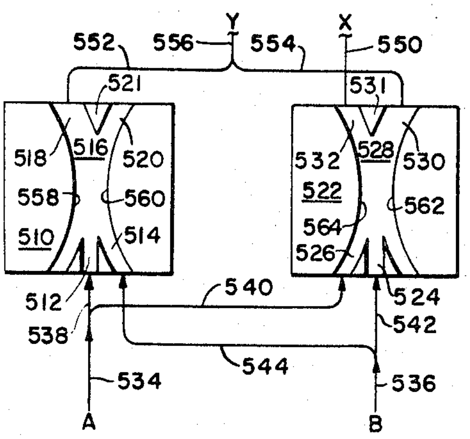
FIGURE 7 is a schematic diagram of a first embodiment of a half-adder employing two induction type fluid amplifiers.

FIGURE 7 illustrates an embodiment of a half-adder employing two induction fluid amplifiers 510 and 522 of the type described in Patent No. 3,030,979. Amplifier 510 includes a power stream nozzle 512, a control stream nozzle 514, a chamber 516, and first and second output channels 518 and 520 separated by a dividing element 521. Similarly, amplifier 522 includes a power stream nozzle 524, a control stream nozzle 526, a chamber 528, and first and second output channels 530 and 532 separated by a dividing element 531.

A first sequence of fluid signals is applied to a pipe 534 and a second sequence of fluid signals is applied to a pipe 536. The pipe 534 is connected by a pipe 538 to the power nozzle 512, and is connected by a pipe 540 to the control nozzle 526. The pipe 536 is connected by a pipe 542 to the power nozzle 524, and is connected by a pipe 544 to the control nozzle 514. Output channels 518 and 530 are connected by means of two pipes 552 and 554, respectively, to a first output pipe 556. A second output pipe 550 is connected to the channel 532.

When the input signals A and B are both zero there is no fluid input to either of the pipes 534 and 536. Accordingly, there is no fluid flow to either the X or the Y output.

When input signal A is a one and input signal B is a zero fluid flows through pipes 534 and 538, nozzle 512, channel 518, and pipes 552 and 556 to the Y output. The dividing element 521 is offset from the axis of the power nozzle so that in the absence of a control stream the power stream normally flows into channel 518. Similarly, dividing element 531 is offset to one side of the axis of power nozzle 524 so that the power stream of amplifier 522 normally flows into channel 530 when there is no control stream flow. Therefore, when the signal A is zero and the signal B is one, fluid flows through pipes 536 and 542, power nozzle 524, channel 530, and pipes 554 and 556 to the Y output.

When the input signals A and B are both one fluid flows into both pipes 534 and 536. Part of the fluid from pipe 534 is applied to power nozzle 512 and the remaining portion flows through pipe 540 to the control nozzle 526. Concurrently, part of the fluid from pipe 536 is applied to power nozzle 524 with the remaining portion flowing through pipe 544 to control nozzle 514.

In amplifier 510, the control stream tends to attach to the wall 560. Furthermore, as explained in Patent No. 3,030,979 the control stream attracts the power stream so that they both flow along wall 560 and through channel 520 to the atmosphere.

In amplifier 522, the control stream tends to follow the curvature of wall 564 and attracts the power stream so that they both flow through channel 532 and pipe 550 to the X output.

Figure 8:
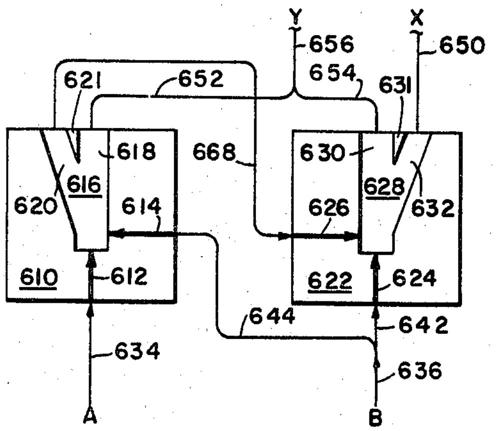
FIGURE 8 is a schematic diagram of a half-adder employing two fluid amplifiers of the type operating on the principle of momentum exchange.
Figure 9:
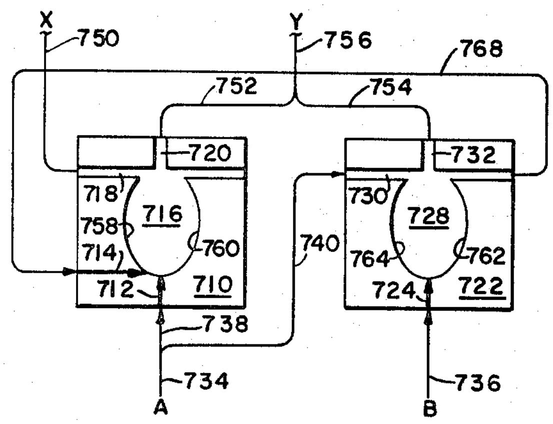
FIGURE 9 is a schematic diagram of yet another embodiment of a half-adder of the type having a vortex chamber; and, FIGURE 10 is a schematic diagram of a second embodiment of a half-adder employing two induction type fluid amplifiers.
Figure 10:
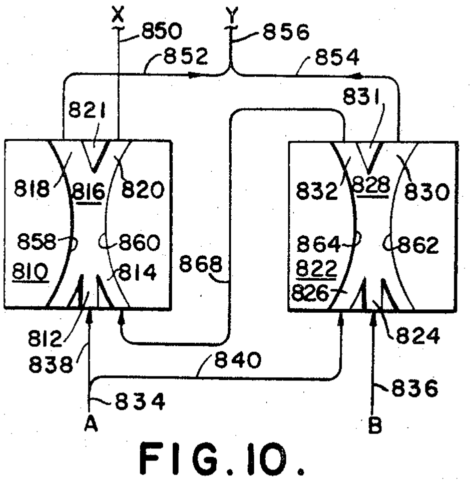

In each of the above-described embodiments each sequence of input signals was applied in a more or less direct manner to both amplifiers comprising the half-adder. FIGURES 8, 9 and 10 illustrate different arrangements wherein one of the sequences of input signals is applied to only one amplifier with the other sequence being applied to both amplifiers. Although this permits a slight reruction in the number of channels required there is an attendant disadvantage in that it takes a longer period of time for the outputs of the half-adder to reach their final or steady state condition.

Referring now to FIGURE 8, the half-adder circuit shown therein includes two fluid amplifiers 610 and 622. The amplifier 610 has a power nozzle 612, a control nozzle 614, an interaction chamber 616, and first and second output channels 618 and 620. Amplifier 622 includes a power nozzle 624, a control nozzle 626, an interaction chamber 628, and first and second output channels 630 and 632. The output channels 618 and 630 are axially aligned with power nozzles 612 and 624, respectively, so as to normally receive the power streams issuing therefrom.

A first sequence of signals is applied by means of a pipe 634 to the power nozzle 612. A second sequence of signals is applied to a pipe 636 which is connected by a pipe 642 to the power nozzle 624 and is connected by a pipe 644 to the control nozzle 614.

The output channels 618 and 630 are connected by pipes 652 and 654, respectively, to a first output pipe 656. A second output pipe 650 is connected to channel 632. In addition, channel 620 is connected by means of pipe 668 to the control nozzle 626.

The half-adder of FIGURE 8 functions as follows. With input signals A and B both zero there is no power stream flow into either amplifier and accordingly no fluid flow to either output X or output Y.

If input signal A is one and signal B is zero fluid flows through pipe 634, nozzle 612, channel 618, and pipe 652 to the Y output. If input signal A is zero and signal B is one fluid flows through pipes 636 and 642, nozzle 624, channel 630, and pipes 654 and 656 to the Y output.

If signals A and B are both ones, fluid flow into pipes 634 and 636. The fluid from pipe 634 flows through nozzle 612 and creates a power stream in amplifier 610. Part of the fluid from pipe 636 flows through pipe 644 and control nozzle 614 to deflect the power stream of amplifier 610 into channel 620. The power stream flows from channel 620 through pipe 668 and nozzle 626 to create a control stream in amplifier 622. At this time part of the fluid from pipe 636 is flowing through pipe 642 and nozzle 624 to create a power stream in amplifier 622. The control stream deflects the power stream so that it flows through channel 632 in pipe 650 to the X output.

FIGURE 9 shows another embodiment of a half-adder employing vortex amplifiers. The half-adders comprises two amplifiers 710 and 722. Since the amplifier 710 is like the amplifier 22 and the amplifier 722 is like the amplifier 122 previously described, a further description of the amplifiers is deemed unnecessary. Briefly, the circuit functions as follows.

When input signals A and B are both zero there is no fluid flow into either input pipe 734 or 736 and consequently there is no flow to either output X or Y. When input signal A is one and signal B is zero fluid flows through pipes 734 and 738, nozzle 712, chamber 716, channel 720, and pipes 752 and 756 to the Y output. When input signal A is zero and B is one fluid flows through pipe 736, nozzle 724, chamber 728, channel 732, and pipes 754 and 756 to output Y.

When input signals A and B are both one there is fluid flow into both pipes 734 and 736. The signal B must lag the signal A or else a delay element must be inserted in pipe 736. The reason is as follows. Part of the fluid flow through pipe 734 passes through pipe 740 and channel 730 to create a clockwise control vortex flow of small magnitude in the chamber 728. As explained with reference to FIGURE 3 this control vortex flow must exist at the instant the power stream is initiated. When the power stream is initiated in amplifier 722 as a result of the delayed input signal in pipe 736, the control vortex flow deflects the power stream toward wall 764. The power stream flows upwardly along wall 764, through channel 730, pipe 768, and nozzle 714 to create a control stream in chamber 716. A power stream already exists in chamber 716 as a result of the A signal being applied to pipe 734. The control stream deflects the power stream toward wall 760 and it flows upwardly along this wall and through channel 718 and pipe 750 to the X output.

FIGURE 10 illustrates another embodiment of a half-adder employing induction amplifiers of the type shown in FIGURE 7. In view of the prior description of FIGURE 7 the operation of the circuit shown in FIGURE 10 is believed to be obvious.

Briefly, the circuit produces no fluid output signals when input signals A and B are both zero and no fluid is applied to either input pipe 834 or 836.

When input signal A is zero and B is one fluid flows through pipe 836, nozzle 824, channel 830, and pipes 854 and 856 to the Y output. When input signal A is a one and B is zero fluid flows through pipes 834 and 838, nozzle 812, channel 818, and pipes 852 and 856 to the Y output.

When input signals A and B are both one fluid flows through both pipes 843 and 836. The fluid in pipe 836 is applied to nozzle 824 to create a power stream in amplifier 822. Part of the fluid from pipe 834 is applied to nozzle 812 to create a power stream in amplifier 810 and the remaining portion of the fluid from pipe 834 is applied to nozzle 826 to create a control stream. The control stream from nozzle 826 induces the power stream of amplifier 822 to follow the curvature of wall 864 so that it flows through channel 832, pipe 868, and nozzle 814. This creates a control stream in amplifier 810 and this control stream induces the power stream to follow the curvature of wall 860. Thus, the power stream of amplifier 810 flows through channel 820 and pipe 850 to the X output.

In summary, FIGURES 1 and 3 through 10 each show a combination comprising two pure fluid amplifiers interconnected in a novel manner to provide either a comparison device or a half adder. Each of these embodiments may be used alone or in combination with the circuit of FIGURE 2. This circuit provides timing means for sampling the output of the half-adder and means for storing an indication of the output of the half-adder. The storage means is designed to have automatic reset so that it can provide a positive indication manifested by fluid flow, when the two input signals to the half-adder are both zero.

Various modifications falling within the spirit and scope of the invention will be obvious. For example, the interconnecting means between fluid amplifiers are described as pipe for the sake of simplicity. However, any suitable fluid conveying means may be employed, including channels formed in substantially solid bodies like those of the fluid amplifiers described herein.

The embodiments of the invention in which an exclusive property or privilege is claimed are defined as follows:

1. A comparison circuit responsive to first and second fluid input signals for producing a fluid signal at a first output when said input signals are equal and a fluid signal at a second output when said input signals are unequal, said circuit comprising:

first means responsive to said first and second fluid input signals for producing an equality signal only when said input signals are both binary ones;

second means responsive to said first and second fluid input signals for producing an inequality signal when said input signals are unequal;

a fluid amplifier having:

a power stream nozzle, first and second outputs, first and second control nozzles for selectively deflecting a power stream issuing from said power stream nozzle to said first or said second output, respectively;

said amplifier further including means for normally directing a power stream issuing from said power stream nozzle to said first output if neither of said control nozzles deflects said power stream at the time it begins to issue;

means for applying said equality signal to said first control nozzle;

means for applying said inequality signal to said second control nozzle; and means for intermittently applying fluid to said power stream nozzle to cause said power stream to issue therefrom.

2. A fluid logic circuit comprising:
first and second fluid vortex amplifiers each having:
a first output channel,
a second output channel intersecting said first output channel,
a vortex chamber intersecting said first output channel,
a power nozzle connecting with said vortex chamber at its upstream extent,
said power nozzle, said vortex chamber, and said second output channel being longitudinally aligned whereby a power stream issuing from said power nozzle normally flows into said second channel,
first delay means connected to the power nozzle of said amplifier,
second delay means connected to the power nozzle of said second amplifier,
means for applying a first fluid signal to said first delay means and one end of the first output channel of the second amplifier,
means for applying a second fluid signal to said second delay means and one end of the first output channel of said first amplifier,
and means connecting said second output channels to a common output,
said fluid signals applied to the ends of said output channels flowing into said vortex chambers to create control vortex flows which direct power streams entering the chambers into said first output channels in the same direction as the direction of flow of said fluid signals therethrough.

3. A fluid logic circuit comprising:
first and second fluid vortex amplifiers each having:
an output channel,
a vortex chamber intersecting said output channel intermediate its ends, and
a power nozzle connecting with said vortex chamber at its upstream extent,
said vortex chambers being shaped to normally direct a power stream in a predetermined direction of flow so that it flows toward a predetermined end of the corresponding output channel,
first delay means connected to the power nozzle of said first amplifier,
second delay means connected to the power nozzle of said second amplifier;
means for applying a first fluid signal to said first delay means and said predetermined end of the output channel of said second amplifier,
means for applying a second fluid signal to said second delay means and said predetermined end of said first amplifier, and
means connecting said predetermined ends to a common output,
said fluid signals applied to said predetermined ends flowing into said vortex chambers to create control vortex flows which direct power streams entering the chambers into said output channels in the same direction as the direction of flow of said fluid signals therethrough.

4. The combination comprising:
first and second fluid amplifiers each having:
a fluid chamber,
first and second output channels intersecting at their upstream extent to form said chamber,
and a power nozzle connected to said chamber at its upstream extent,
said chamber being configured to normally cause a power stream entering the chamber to flow into said first output channel,
means for applying a first signal to the power nozzle of said first amplifier and the first output channel of said second amplifier,
means for applying a second signal to the power nozzle of said second amplifier and the first output channel of said first amplifier,
said first and second signals being applied to said first output channels in a direction to backload said amplifiers and cause switch of the power stream flow into the second output channels,
and means connecting said first output channels to a common output.

5. The combination comprising:
first and second fluid amplifiers each having:
a fluid chamber,
first and second output channels intersecting at their upstream extent to form said chamber,
a power nozzle connected to said chamber at its upstream extent to normally direct a power stream toward said first output channel,
and a control nozzle for deflecting a power stream from said chamber into said second output channel,
means for applying a first signal to the power nozzle of the first amplifier,
means for applying a second signal to the power nozzle of the second amplifier and the control nozzle of the first amplifier,
means connecting the second output channel of the first amplifier to the control nozzle of the second amplifier,
and means connecting the first output channels of both amplifiers to a common output.

6. A fluid logic circuit comprising:
first and second fluid vortex amplifiers each having:
a first output channel,
a second output channel intersecting said first output channel,
a vortex chamber intersecting said first output channel,
a power nozzle connecting with said vortex chamber at its upstream extent,
said power nozzle, said vortex chamber, and said second output channel being longitudinally aligned whereby a power stream issuing from said power nozzle normally flows into said second channel,
means for applying a first fluid signal to the power nozzle of said first amplifier and one end of the first output channel of the second amplifier,
means for applying a second fluid signal to the power nozzle of said second amplifier,
a control nozzle connecting with the vortex chamber of said first amplifier,
means connecting the end of the first output channel of the second amplifier opposite said one end to said control nozzle,
and means connecting said second output channels to a common output,
said first fluid signal applied to the one end of said first output channel of said second amplifier flowing into said vortex chamber of said second amplifier to create a control vortex flow which directs a power stream entering the chamber into said first output channel in the same direction as the flow of said first fluid signal therethrough.

7. A fluid logic device comprising:
first and second induction fluid amplifiers each having:
a power nozzle,
a control nozzle,
a first output channel,
a second output channel,
means for applying a first fluid signal to the power nozzle of said first amplifier and the control nozzle of said second amplifier, means for applying a second fluid signal to the power nozzle of said second amplifier, means connecting the second output channel of the second amplifier to the control nozzle of the first amplifier, and means connecting the first output channels of both said amplifiers to a common output.

References Cited

UNITED STATES PATENTS

| | | | |
|---|---|---|---|
| 3,030,979 | 4/1962 | Reilly | 137—81.5 |
| 3,192,938 | 7/1965 | Bauer | 137—81.5 |
| 3,227,368 | 1/1966 | Jacoby | 235—201 |
| 3,238,961 | 3/1966 | Hatch | 137—81.5 |
| 3,246,661 | 4/1966 | Bauer | 137—81.5 |
| 3,250,470 | 5/1966 | Grubb | 235—201 |
| 3,272,214 | 9/1966 | Warren | 137—81.5 |
| 3,299,255 | 1/1967 | Bauer | 137—81.5 XR |
| 3,339,569 | 9/1967 | Bauer et al. | 137—81.5 |
| 3,340,885 | 9/1967 | Bauer | 137—81.5 |

SAMUEL SCOTT, *Primary Examiner.*

U.S. Cl. X.R.

235—201